(12) United States Patent
Nickel et al.

(10) Patent No.: US 8,847,617 B2
(45) Date of Patent: Sep. 30, 2014

(54) NON-CONTACT TEST SYSTEM FOR DETERMINING WHETHER ELECTRONIC DEVICE STRUCTURES CONTAIN MANUFACTURING FAULTS

(75) Inventors: Joshua G. Nickel, San Jose, CA (US); Jonathan P. G. Gavin, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 577 days.

(21) Appl. No.: 13/092,808

(22) Filed: Apr. 22, 2011

(65) Prior Publication Data

US 2012/0268153 A1 Oct. 25, 2012

(51) Int. Cl.
*G01R 31/302* (2006.01)

(52) U.S. Cl.
CPC .................................. *G01R 31/3025* (2013.01)
USPC .................................. 324/754.31; 324/754.21

(58) Field of Classification Search
None
See application file for complete search history.

(56) References Cited

U.S. PATENT DOCUMENTS

| | | | |
|---|---|---|---|
| 5,631,572 A | 5/1997 | Sheen et al. | |
| 6,236,220 B1 | 5/2001 | Enguent | |
| 7,081,869 B2 | 7/2006 | Sommerfeld et al. | |
| 7,249,302 B2 | 7/2007 | Maltseff et al. | |
| 7,639,137 B2* | 12/2009 | Mukherjee | 340/572.1 |
| 2003/0016039 A1 | 1/2003 | Williams et al. | |
| 2004/0140821 A1 | 7/2004 | Lee | |
| 2005/0086021 A1* | 4/2005 | Khandros et al. | 702/121 |
| 2006/0197538 A1 | 9/2006 | Leinonen et al. | |
| 2008/0204055 A1* | 8/2008 | Pagani | 324/750 |
| 2009/0281381 A1 | 11/2009 | Takenaka et al. | |
| 2010/0060529 A1 | 3/2010 | Schlub et al. | |
| 2010/0102829 A1* | 4/2010 | Azarian | 324/651 |
| 2011/0279138 A1* | 11/2011 | Mutnury et al. | 324/755.01 |

FOREIGN PATENT DOCUMENTS

| | | |
|---|---|---|
| JP | 2006171978 | 6/2006 |
| WO | 9520766 | 8/1995 |

OTHER PUBLICATIONS

Nickel et al. U.S. Appl. No. 13/097,847, filed Apr. 29, 2011.
Nickel et al. U.S. Appl. No. 13/111,926, filed May 19, 2011.
Daliri et al., "Circular Microstrip Patch Antenna Strain Sensor for Wireless Structural Health Monitoring" Proceedings of the World Congress on Engineering 2010 vol. II, WCE 2010, Jun. 30-Jul. 2, 2010, London, U.K.
Blabac, "Surface penetrating radar for condition assessment of concrete masonry structures", [retrieved on Apr. 22, 2011]. Retrieved from the Internet: http://www.gostructural.com/print-magazinearticle-seeing_is_believing-4167.html.

(Continued)

*Primary Examiner* — Minh N Tang
(74) *Attorney, Agent, or Firm* — Trey Law Group; G. Victor Treyz; Michael H. Lyons

(57) ABSTRACT

Electronic device structures such as structures containing antennas, connectors, welds, electronic device components, conductive housing structures, and other structures can be tested for faults using a non-contact test system. The test system may include a vector network analyzer or other test unit that generates radio-frequency tests signals in a range of frequencies. The radio-frequency test signals may be transmitted to electronic device structures under test using an antenna probe that has one or more test antennas. The antenna probe may receive corresponding radio-frequency signals. The transmitted and received radio-frequency test signals may be analyzed to determine whether the electronic device structures under test contain a fault.

14 Claims, 24 Drawing Sheets

(56) References Cited

OTHER PUBLICATIONS

Ghodgaonkar et al., "Microwave Nondestructive Testing of Composite Materials using Free-Space Microwave Measurement Techniques", [retrieved on Apr. 22, 2011]. Retrieved from the Internet: http://www.ndt.net/article/wcridt00/papers/idn251/idn251.htm.

Zoughi et al., "Microwave and millimetre wave sensors for crack detection", (abstract) Aug. 2008 [retrieved on Apr. 22, 2011]. Retrieved from the Internet: http://scholarsmine.mst.edu/post_printsMicrowaveAndMillimetreWaveSensorsForCrackDe_09007dcc805a931d.html.

Abou-Khousa et al., "Novel and simple high-frequency single-port vector network analyzer" (abstract) Mar. 2010 [retrieved on Apr. 22, 2011].Retrieved from the Internet: http://scholarsmine.mst.edu/post_prints/NovelAndSimpleHighFrequencySinglePortVect_09007dcc808993ba.html.

Nickel et al. U.S. Appl. No. 12/869,617, filed Aug. 26, 2010.
Nickel et al., U.S. Appl. No. 13/183,393, filed Jul. 14, 2011.

* cited by examiner

NON-CONTACT TEST SYSTEM FOR DETERMINING WHETHER ELECTRONIC DEVICE STRUCTURES CONTAIN MANUFACTURING FAULTS

BACKGROUND

This relates to testing and, more particularly, to testing of electronic device structures.

Electronic devices such as computers, cellular telephones, music players, and other electronic equipment are often provided with wireless communications circuitry. In a typical configuration, the wireless communications circuitry includes an antenna that is coupled to a transceiver on a printed circuit board using a cable and connectors. Connectors and cables are also used to convey other signals such as digital data signals in an electronic device. Many electronic devices include conductive structures with holes, slots, and other shapes. Welds and springs may be used in forming connections between conductive structures such as these and electronic device components.

During device assembly, workers and automated assembly machines may be used to form welds, machine features into conductive device structures, connect connectors for antennas and other components to mating connectors, and otherwise form and interconnect electronic device structures. If care is not taken, however, faults may result that can impact the performance of a final assembled device. For example, a metal part may not be machined correctly or a connector may not be seated properly within its mating connector. In some situations, it can be difficult or impossible to detect and identify these faults, if at all, until assembly is complete and a finished device is available for testing. Detection of faults only after assembly is complete can results in costly device scrapping or extensive reworking.

It would therefore be desirable to be able to provide improved ways in which to detect faults during the manufacturing of electronic devices.

SUMMARY

A non-contact test system may be provided for performing tests on electronic device structures. The electronic device structures may be tested during manufacturing, before or after the structures are fully assembled to form a finished electronic device. Testing may reveal faults that might otherwise be missed in tests on finished devices and may detect faults at a sufficiently early stage in the manufacturing process to allow parts to be reworked or scrapped at minimal.

The electronic device structures may contain structures such as antennas, connectors and other conductive structures that form electrical connections, welds, solder joints, conductive traces, conductive surfaces on conductive housing structures and other device structures, dielectric layers such as foam layers, electronic components, and other structures. These structures can be tested using wireless test signals from the non-contact test system. During testing, the device structures under test may be placed in a test fixture.

The test system may include a vector network analyzer or other test unit that generates radio-frequency tests signals in a range of frequencies. The radio-frequency test signals may be transmitted to electronic device structures under test using an antenna probe. The antenna probe may include one or more test antennas for transmitting the radio-frequency test signals. During testing, the test antennas may be placed in the vicinity of corresponding structures to be tested such as electronic device antennas, connectors, structures with welds, electronic components, conductive housing structures, conductive traces, conductive surfaces on housing structures or other device structures, device structures including dielectric layers, structures with solder joints, and other structures. The antenna probe may use the test antennas to receive corresponding radio-frequency signals from the device structures under test. For example, the antenna probe may use one or more antennas to receive reflected radio-frequency signals or radio-frequency signals that have been transmitted through the device structures under test. The transmitted and reflected radio-frequency test signals may be analyzed to produce complex impedance measurements and complex forward transfer coefficient measurements. These measurements or other gathered test data may be compared to previously obtained baseline measurements on properly assembled structures to determine whether the electronic device structures under test contain a fault.

Further features of the invention, its nature and various advantages will be more apparent from the accompanying drawings and the following detailed description of the preferred embodiments.

DETAILED DESCRIPTION

Electronic devices may be assembled from conductive structures such as conductive housing structures. Electronic components within the structures such as speakers, microphones, displays, antennas, switches, connectors, and other components, may be mounted within the housing of an electronic device. Structures such as these may be assembled using automated manufacturing tools. Examples of automated manufacturing tools include automated milling machines, robotic pick-and-place tools for populating printed circuit boards with connectors and integrated circuits, computer-controlled tools for attaching connectors to each other, and automated welding machines (as examples). Manual assembly techniques may also be used in assembling electronic devices. For example, assembly personnel may attach a pair of mating connectors to each other by pressing the connectors together.

Regardless of whether operations such as these are performed using automated tools or manually, there will generally be a potential for error. Parts may not be manufactured properly and faults may arise during assembly operations.

With conventional testing arrangements, these faults may sometimes be detected after final assembly operations are complete. For example, over-the-air wireless tests on a fully assembled device may reveal that an antenna is not performing within desired limits. This type of fault may be due to improper connection of a pair of connectors in the signal path between the antenna and a radio-frequency transceiver. Detection of faults at late stages in the assembly process may, however, result in the need for extensive reworking. It may often be impractical to determine the nature of the fault, forcing the device to be scrapped.

Figure 1A:
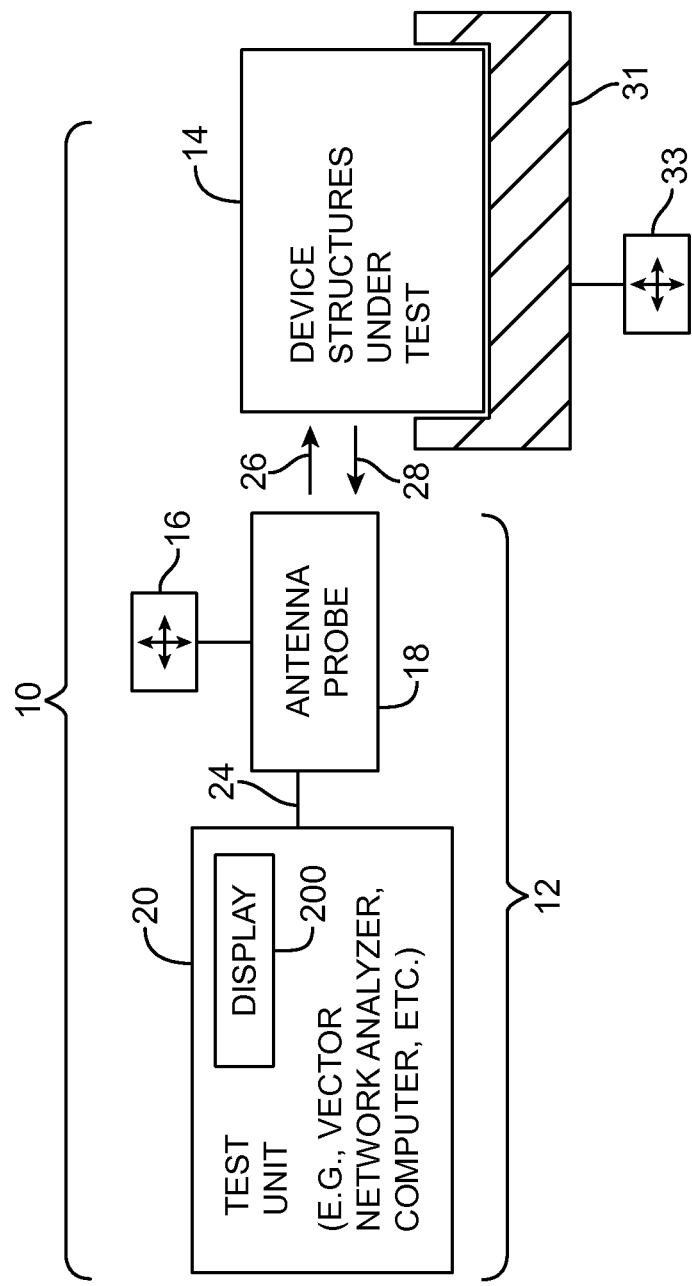
FIG. 1A is a diagram of an illustrative test system environment in which electronic device structures may be tested using a non-contact tester with a wireless probe in accordance an embodiment of the present invention.

Earlier and potentially more revealing and accurate tests may be performed by using a wireless probe structure to wirelessly test electronic device structures. An illustrative test system with a wireless probe for use in testing electronic device structures is shown in FIG. 1A. In test system 10, tester 12 may be used to perform wireless (non-contact) tests on device structures under test 14. Device structures under test 14 may include portions of an electronic device such as conductive housing structures, electronic components such as microphones, speakers, connectors, switches, printed circuit boards, antennas, parts of antennas such as antenna resonating elements and antenna ground structures, metal parts that are coupled to each other using welds, assemblies formed from two or more of these structures, or other suitable electronic device structures. These test structures may be associated with any suitable type of electronic device such as a cellular telephone, a portable computer, a music player, a tablet computer, a desktop computer, a display, a display that includes a built-in computer, a television, a set-top box, or other electronic equipment.

Tester 12 may include a test unit such as test unit 20 and one or more wireless probes such as antenna probe 18. Antenna probe 18 may be used to transmit radio-frequency signals 26 to device structures 14 and may be used to receive corresponding radio-frequency signals 28 from device structures under test 14. The transmitted and received signals may be processed to compute complex impedance data (sometimes referred to as S11 parameter data), complex forward transfer coefficient data (sometimes referred to as S21 data), or other suitable data for determining whether device structures 14 contain a fault.

Antenna probe 18, which may sometimes be referred to as a wireless probe, may include one or more antennas. The antennas in antenna probe 18, which are sometimes referred to herein as test antennas or probe antennas, may be implemented using any suitable antenna type (e.g., loop antennas, patch antennas, dipole antennas, monopole antennas, inverted-F antennas, planar inverted-F antennas, coil antennas, open-ended waveguides, horn antennas, etc.).

During testing, antenna probe 18 may be placed in the vicinity of device structures under test 14. For example, antenna probe 18 may be placed within 10 cm or less of device structures under test 14, within 2 cm or less of device structures under test 14, or within 1 cm or less of device structures under test 14 (as examples). These distances may be sufficiently small to place antenna probe 18 within the "near field" of device structures under test 14 (i.e., a location at which signals are received by an antenna that is located within about one or two wavelengths from device structures under test 14 or less). Device structures under test 14 may be mounted in a test fixture such as test fixture 31 during testing. Test fixture 31 may contain a cavity that receives some or all of device structures under test 14. Test fixture 31 may, if desired, be formed from dielectric materials such as plastic to avoid interference with radio-frequency test measurements. The relative position between antenna probe 18 and device structures under test 14 may be controlled manually by an operator of test system 10 or may be adjusted using computer-controlled or manually controlled positioners such as positioners 16 and 33. Positioners 16 and 33 may include actuators for controlling lateral and/or rotational movement of antenna probe 18 and/or device structures under test 14, respectively.

Test unit 20 may include signal generator equipment that generates radio-frequency signals over a range of frequencies. These generated signals may be provided to antenna probe 18 over path 24 and may be transmitted towards device structures under test 14 as transmitted radio-frequency test signals 26. Test unit 20 may also include radio-frequency receiver circuitry that is able to gather information on the magnitude and phase of corresponding received signals from device structures under test 14 (i.e., radio-frequency signals 28 that are reflected from device structures under test 14 and that are received using antenna probe 18 or radio-frequency signals 28 that have passed through device structures under test 14). Using the transmitted and received signals, the magnitude and phase of the complex impedance and/or complex forward transfer coefficient of the device structures under test may be determined. With one suitable arrangement, test unit 20 may be a vector network analyzer (VNA) or other network analyzer and a computer that is coupled to the vector network analyzer for gathering and processing test results. This is, however, merely illustrative. Test unit 20 may include any suitable equipment for generating radio-frequency test signals of desired frequencies while measuring and processing corresponding received signals.

The radio-frequency signals that are generated by test unit 20 may be supplied to antenna probe 18 using path 24. Path 24 may include, for example, a coaxial cable or, when multiple test antennas are included in antenna probe 18, may include multiple coaxial cables, each associated with a respective one of test antennas.

By analyzing the transmitted and reflected signals, test unit 20 may obtain measurements such as s-parameter measurements that reveal information about whether device structures under test 14 are faulty. Test unit 20 may, for example, obtain an S11 (complex impedance) measurement and/or an S21 (complex forward transfer coefficient) measurement. The values of S11 and S21 (phase and magnitude) may be measured as a function of signal frequency. In situations in which device structures under test 14 are fault free, S11 and S21 measurements will have values that are relatively close to baseline measurements on fault-free structures (sometimes referred to as reference structures or a "gold" unit). In situations in which device structures under test 14 contain a fault that affects the electromagnetic properties of device structures under test 14, the S11 and S21 measurements will exceed normal tolerances. When test unit 20 determines that the S11 and/or S21 measurements have deviated from normal S11 and S21 measurements by more than predetermined limits, test unit 20 can alert an operator that device structures under test 14 likely contain a fault and/or other appropriate action can be taken. For example, an alert message may be displayed on display 200 of test unit 20. The faulty device structures under test 14 may then be repaired to correct the fault or may be scrapped. With one suitable arrangement, an operator of system 10 may be alerted that device structures under test 14 have passed testing by displaying an alert message such as a green screen and/or the message "pass" on display 200. The operator may be alerted that device structures under test 14 have failed testing by displaying an alert message such as a green screen and/or the message "fail" on display 200 (as examples). If desired, S11 and/or S21 data can be gathered over limited frequency ranges that are known to be sensitive to the presence or absence of faults. This may allow data to be gathered rapidly (e.g., so that the operator may be provided with a "pass" or "fail" message within less than 30 seconds, as an example).

Figure 1B:
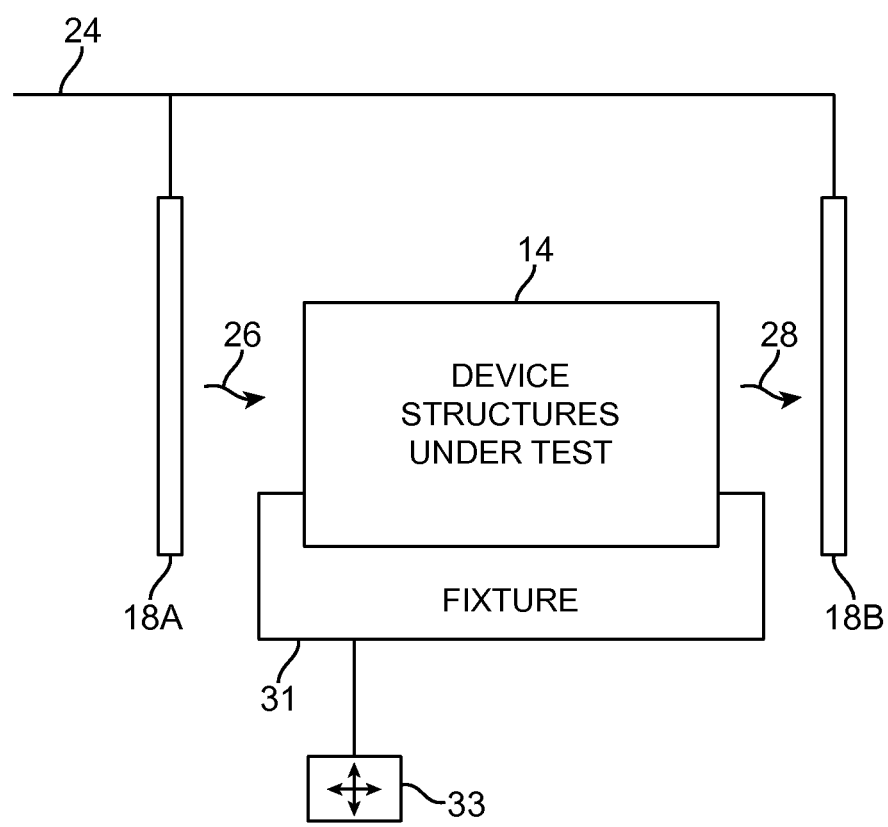
FIG. 1B is a diagram of illustrative test system equipment in which probe antennas are used to transmit test signals through device structures under test in accordance with an embodiment of the present invention.

Complex impedance measurements (S11 phase an magnitude data) on device structures under test 14 may be made by transmitting radio-frequency signals with an antenna and receiving corresponding reflected radio-frequency signals from the device under test using the same antenna. Complex forward transfer coefficient measurements (S21 phase and magnitude data) on device structures under test 14 may be made by transmitting radio-frequency signals with a first antenna and receiving a corresponding set of radio-frequency signals from device structures under test 14 using a second antenna. FIG. 1B shows show antenna probe 18 may contain a first antenna such as antenna 18A and a second antenna such as antenna 18B. During testing, antenna 18A may be used to transmit radio-frequency test signals to device structures under test 14. Antenna 18B may be used to receive corresponding test signals from device structures under test 14 so that data such as complex forward transfer coefficient data (S21 parameter data) may be produced.

Test system 10 may be used to detect faults in conductive housing structures, faults associated with welds or solder joints between conductive structures, antenna structure faults, faults in connector structures such as connector structures coupled to cables and printed circuit boards or other conductive structures that form electrical connections, faults in conductive traces, faults in conductive surfaces, faults in dielectric structures adjacent to conductive structures, faults in structures that include components that are electrically connected using springs or other contacts, or faults in other device structures under test 14. Any fault that affects the electromagnetic properties of device structures under test 14 and therefore affects the measured S11 and/or S21 data that is gathered using test unit 20 may potentially be detected using test system 10.

Figure 2:
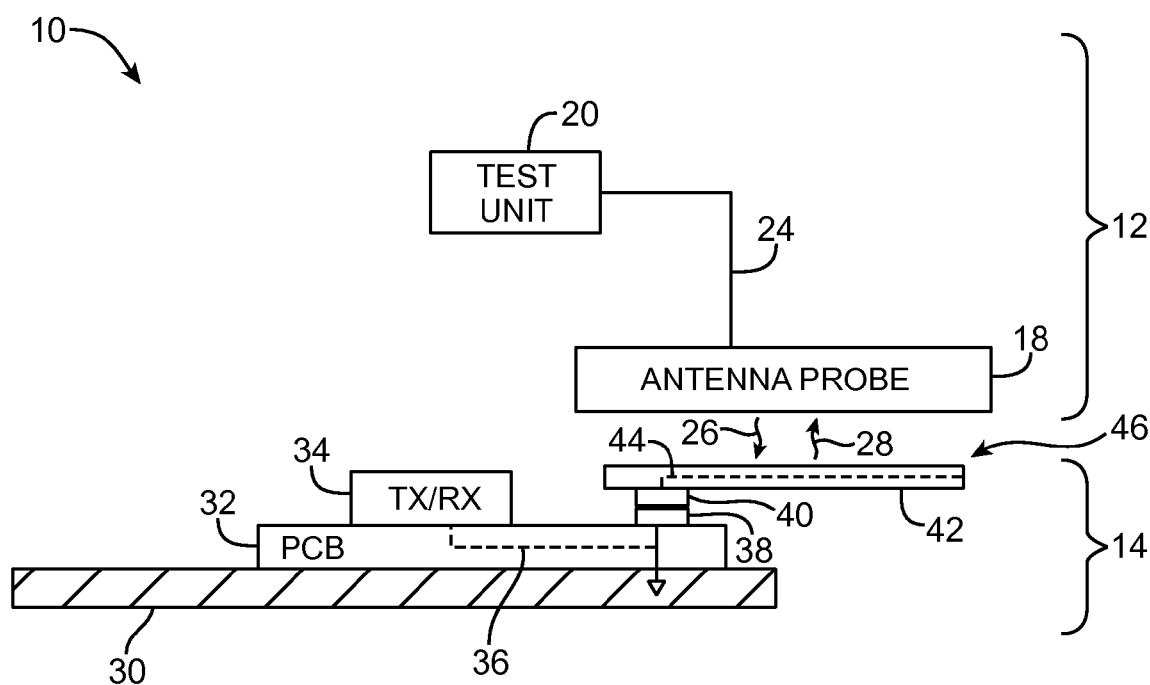
FIG. 2 is a diagram of illustrative electronic device structures with wireless components during testing with a tester that has a wireless probe in accordance with an embodiment of the present invention.

In the illustrative scenario of FIG. 2, for example, non-contact tester 12 is being used to test device structures under test 14 that contain antenna structures. As shown in FIG. 2, device structures under test 14 may include a printed circuit board such as printed circuit board 32. Printed circuit board 32 may be, for example, a rigid printed circuit board formed from fiberglass-filled epoxy (e.g., FR-4) or may be a flexible printed circuit ("flex circuit") formed from a sheet of polymer such as a polyimide sheet. Printed circuit board 32 may be mounted to housing structures such as conductive housing structures 30. Structures 30 and/or conductive metal traces within printed circuit board 32 such as traces 36 may be used to form antenna ground. One or more antennas may be formed using the antenna ground and one or more corresponding antenna resonating elements such as antenna resonating element 46.

A radio-frequency transceiver such as transceiver 34 may be mounted to printed circuit board 32. Conductive traces 36 may be used to form a transmission line (e.g., a microstrip transmission line, a stripline transmission line, an edge coupled microstrip or stripline transmission line, etc.) that is coupled between transceiver 34 and an antenna that is formed from antenna resonating element 46 and antenna ground (e.g., conductive antenna ground structure 30). If desired, one or more segments of coaxial cable may be incorporated within a transmission line path in device structures under test 14. The example of FIG. 2 in which conductive traces 36 in printed circuit board 32 are used in forming a transmission line that is coupled between transceiver 34 and an antenna is merely illustrative.

Antenna resonating element 46 may include antenna resonating element conductive structures such as patterned metal traces 44. Metal traces 44 may be formed on a substrate such as substrate 42. Substrate 42 may be formed from a dielectric such as a plastic support structure, a rigid printed circuit board, or a flexible printed circuit. A connector such as connector 40 may be electrically coupled to antenna resonating element traces 44. Connector 40 may be, for example, a U.FL connector or a W.FL connector (as examples). Connector 40 may mate with a coaxial cable connector or, in the example of FIG. 2, a mating connector such as connector 38 on printed circuit board 32.

The electromagnetic signature (i.e., the S11 and/or S21 measurements made by tester 12) of device structures under test 14 of FIG. 2 may be affected by the way in which these structures are manufactured and assembled. For example, if part of trace 44 or part of trace 36 is not present, antenna resonating element 46 may not be properly connected to transceiver 34 or may have a shape or size that is different than expected. The presence or absence of a proper connection between mating connectors such as connectors 38 and 40 may also influence the electromagnetic signature of device structures under test 14. If, for example, connector 40 has been properly connected to connector 38, antenna resonating element 46 may be properly coupled to the transmission line formed from traces 36 on printed circuit board 32. In this situation, tester 12 may measure normal (expected) values of S11 (or S21) when wirelessly probing device structures under test 14. If, on the other hand, connector 40 has not been properly connected to connector 38 (e.g., because an operator or assembly tool has formed an incomplete or otherwise faulty connection), tester 12 may measure abnormal values of S11 (or S21) when wirelessly probing device structures under test 14 due to the impedance discontinuities or other irregularities resulting from the faulty connection. In response to detection of abnormal wireless measurements on device structures under test 14, tester 12 may generate an audible and/or visual alert for an operator (e.g., an alert displayed on display 200) or may take other suitable actions.

Figure 3:
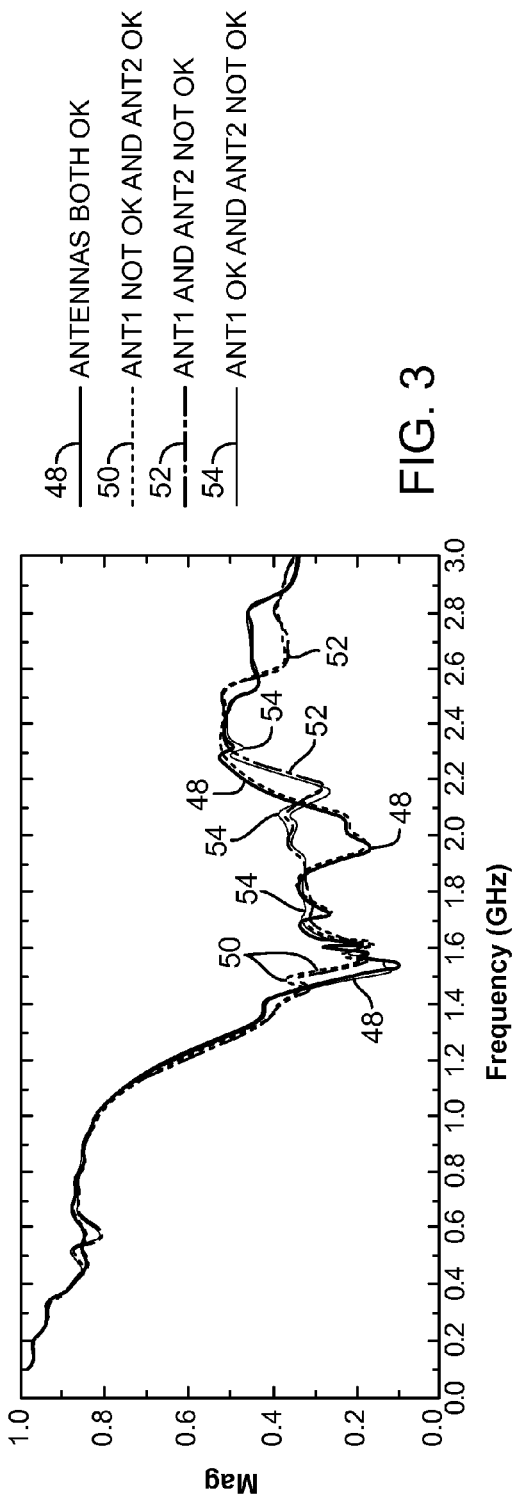
FIG. 3 is a graph showing how the magnitude of reflected radio-frequency signals that are received by a test system probe antenna may vary as a function of whether a test structure contains faults in accordance with an embodiment of the present invention.
Figure 4:
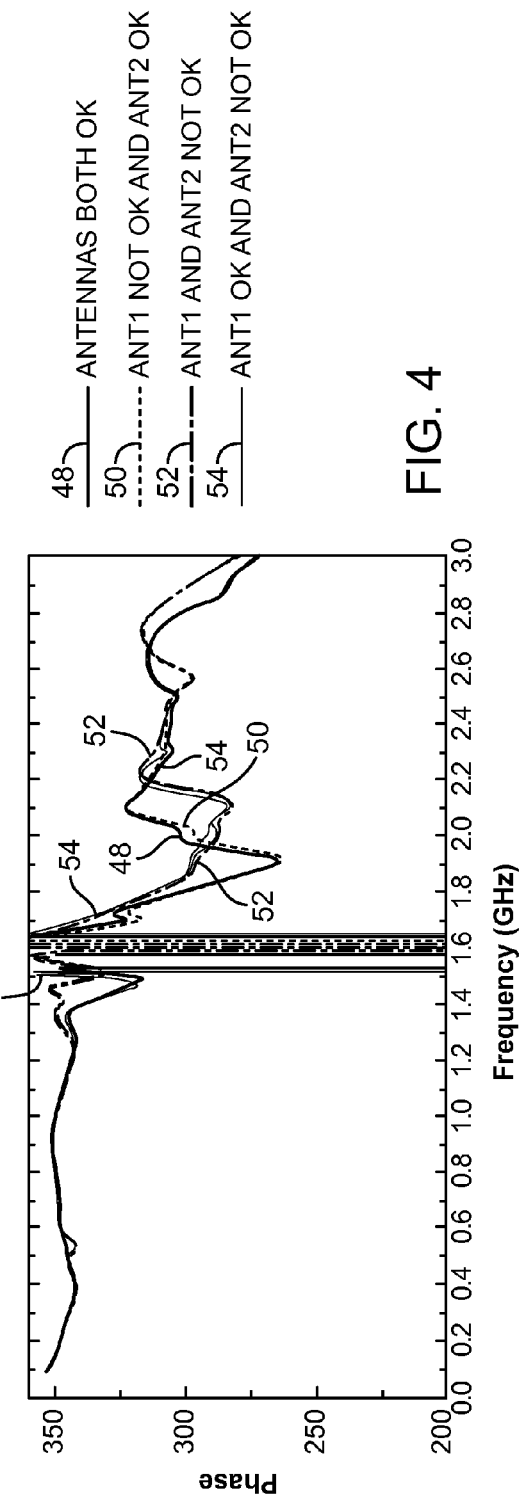
FIG. 4 is a graph showing how the phase of reflected radio-frequency signals that are received by a test system probe antenna may vary as a function of whether a test structure contains faults in accordance with an embodiment of the present invention.

In the graphs of FIGS. 3 and 4, test data gathered by tester 12 is plotted as a function of applied signal frequency over a range of signal frequencies from 0 GHz to 3 GHz. Test measurements may be made using a swept frequency from 0-3 GHz or using other suitable frequency ranges (e.g., frequency ranges starting above 0 GHz and extending to an upper frequency limit of less than 3 GHz or greater than or equal to 3 GHz). The use of a 0-3 GHz test signal frequency range in the example of FIGS. 3 and 4 is merely illustrative. In the graph of FIG. 3, the magnitude of S11 is plotted as a function of frequency. In the graph of FIG. 4, the phase of S11 is plotted as a function of frequency.

The illustrative device structures under test that were used in the test measurements of FIGS. 3 and 4 contained multiple device antennas. The antennas include a first device structures under test antenna (e.g., a WiFi® antenna that is used to handle IEEE 802.11 traffic) and a second device structures under test antenna (e.g., a cellular telephone antenna). The antenna probe 18 that was used in transmitting radio-frequency signals 26 and that was used in gathering reflected radio-frequency signals 28 includes two corresponding test antennas (i.e., a first test antenna that is placed in the vicinity of the first device structures under test antenna and a second test antenna that is placed in the vicinity of the second device structures under test antenna).

FIG. 3 shows S11 magnitude measurements made using the first and second test antennas and FIG. 4 shows an S11 phase measurements made using the first and second test antennas. Initially, during calibration operations, test unit 20 may gather S11 measurements from device structures under test that are known to be fault free. When device structures under test 14 are fault free, the S11 measurements follow curves 48 of FIGS. 3 and 4 (in this example). Curves 48 may therefore represent a baseline (calibration) response for the device structures under test in the absence of faults. The baseline response serves as a reference that can be used to determine when measurements results are meeting expectations or are deviating from expectations.

If one or more faults are present, the S11 measurements made by tester 12 will deviate from curves 48, because the electromagnetic properties of structures 14 will be different than in situations in which structures 14 are free of faults. For example, a disconnected antenna connector will result in an impedance discontinuity in the transmission line path between the antenna and its associated transceiver. Improperly formed antenna structures such as faults in springs or screws or other metal structures (e.g., feed structures, matching element structures, resonating element structures, antenna ground structures, etc.) may also result in detectable changes in electromagnetic properties. When near-field-coupled or far-field coupled electromagnetic signals from antenna probe 18 reach structures 14, the impedance discontinuity in structures 14 (or other fault-related change in structures 14) will produce a change in received signal 28 (and the computed S11 or S21 data) that can be detected by tester 12. In the present example, the S11 measurements will follow curves 50 when the first device antenna contains a fault and the second device antenna is free of faults, will follow curves 52 when both the first and second device antennas are not operating properly, and will follow curves 54 when the first device antenna is operating satisfactorily but the second device antenna is not operating satisfactorily.

The shapes of curves 50, 52, and 54 and the amounts by which curves 50, 52, and 54 vary from the known reference response (curve 48) in FIGS. 3 and 4 is merely illustrative. Device structures under test with different configurations will typically produce different results. Provided that test results measured with tester 14 have detectable differences from the reference curves associated with satisfactory device structures under test (i.e., structures that do not contain faults such as misshapen antenna resonating element traces or other conductive structures, poorly connected or disconnected connectors, etc.), tester 12 will be able to detect when faults are present and will be able to take appropriate actions.

Actions that may be taken in response to detection of a fault in device structures under test 14 include displaying a warning (e.g., on computer monitor 200 in test unit 20, on a status light-emitting diode in test unit 20, or on other electronic equipment associated with test unit 20 that may display visual information to a user), issuing an audible alert, using positioning equipment in system 10 to automatically place the device structures under test 14 in a suitable location (e.g., a reject bin), etc.

Figure 5A:
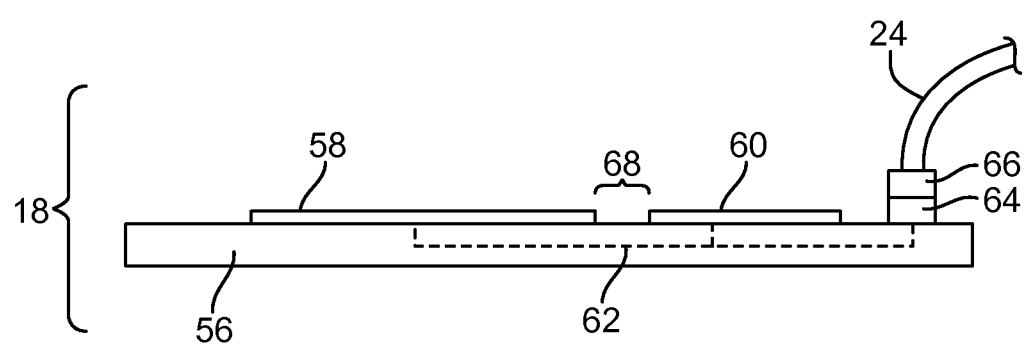
FIG. 5A is a side view of an illustrative probe antenna in accordance with an embodiment of the present invention.

FIG. 5A is a cross-sectional side view of an illustrative antenna probe of the type that may be used in a test system of the type shown in FIG. 1A. As shown in FIG. 5A, antenna probe 18 may include a substrate such as substrate 56. Substrate 56 may be formed from a dielectric such as plastic, may be formed from a rigid printed circuit board substrate such as fiberglass-filled epoxy, may be formed from a flexible printed circuit ("flex circuit") substrate such as a sheet of polyimide, or may be formed from other dielectric substrate materials. Conductive antenna structures may be formed on substrate 56 to form one or more antennas. In the example of FIG. 5A, antenna probe 18 includes conductive traces 58 and 60 on the surface of substrate 56. Traces 58 and 60 may be separated by a gap such as gap 68 and may form a dipole patch antenna. Conductive traces 62 supported by substrate 56 (e.g., one or more surface traces and/or buried metal traces) may be used in electrically coupling a connector such as coaxial cable connector 64 to traces 58 and 60. Connector 64 may receive a mating connector such as coaxial cable connector 66 on the end of coaxial cable 24, thereby coupling antenna probe 18 to test unit 20 (FIG. 1A).

The pattern of traces such as traces 58, 60, and 62 may be used on substrate 56 to form any suitable type of antenna (e.g., a patch antenna, a loop antenna, a monopole antenna, a dipole antenna, an inverted-F antenna, an open or closed slot antenna, a planar inverted-F antenna, etc.). The conductive traces may be used to form an antenna resonating element that is coupled to a positive antenna feed terminal and an antenna ground that is coupled to an antenna ground feed terminal.

Figure 5B:
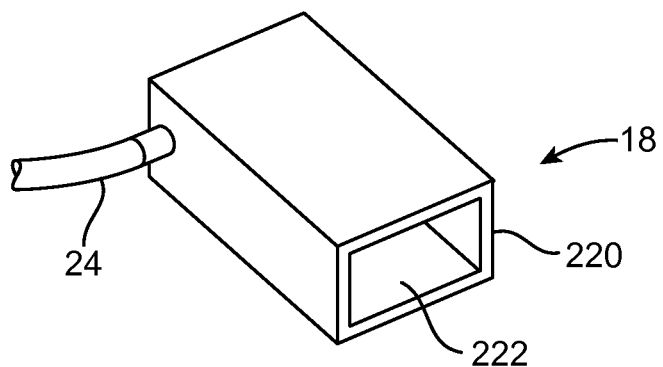
FIG. 5B is a perspective view of an illustrative probe antenna based on an open-ended waveguide in accordance with an embodiment of the present invention.

As shown in FIG. 5B, antenna probe 18 may, if desired, be formed from an open-ended waveguide (i.e., a waveguide having a body such as body 220 with an open end such as open end 222). Open-ended waveguides may operate in frequency ranges such as 3-14 GHz or frequencies above 14 GHz or below 3 GHz, as examples. The antennas that may be used for forming one or more antennas in antenna probe 18 include dipoles, loops, horns, coils, open-ended waveguides, etc.

Figure 6:
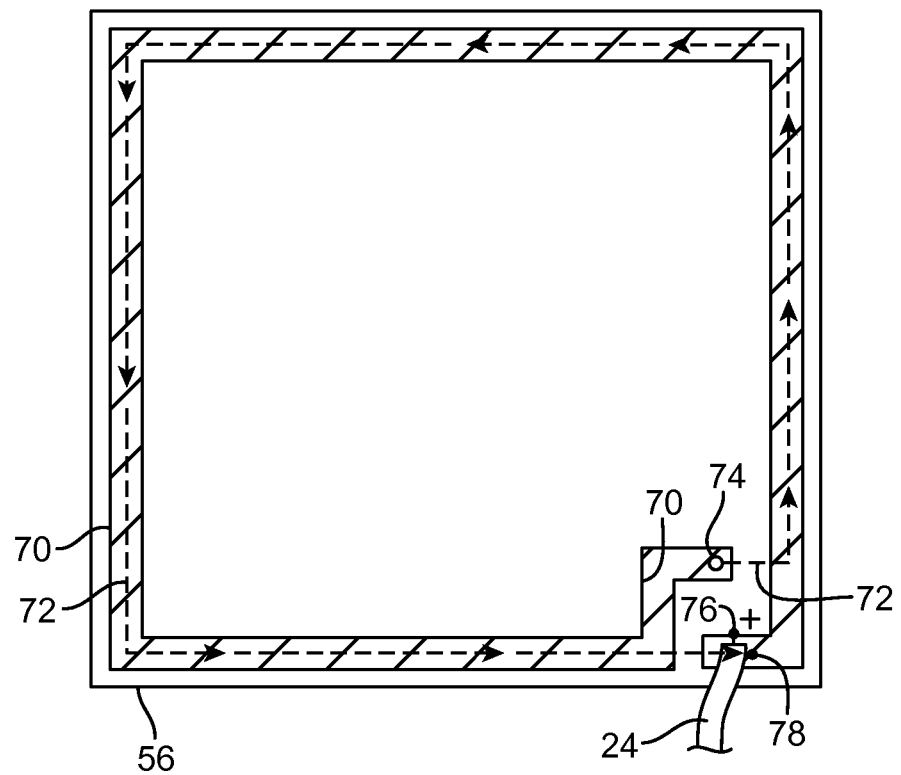
FIG. 6 is a top view of an illustrative wireless probe based on a loop antenna structure in accordance with an embodiment of the present invention.

In the example of FIG. 6, conductive traces 70 on substrate 56 have been used to form a loop antenna. Coaxial cable 24 (or other transmission line) may have a positive conductor coupled to positive antenna feed terminal 76 and a ground conductor coupled to ground antenna feed terminal 78. Positive antenna feed terminal 76 is coupled to upper conductive trace 70. Via 74 couples upper trace 70 to lower trace 72 (e.g., a trace on an opposing surface of a printed circuit board substrate or in a different layer of substrate 56). After looping around the periphery of substrate 56 lower trace 72 may be connected to ground feed terminal 78 by a via structure. The illustrative loop antenna of FIG. 6 uses two loops (upper and lower), but additional loops (e.g., three or more loops) or fewer loops (e.g., a single loop) may be used in antenna probe 18 if desired.

Figure 7:
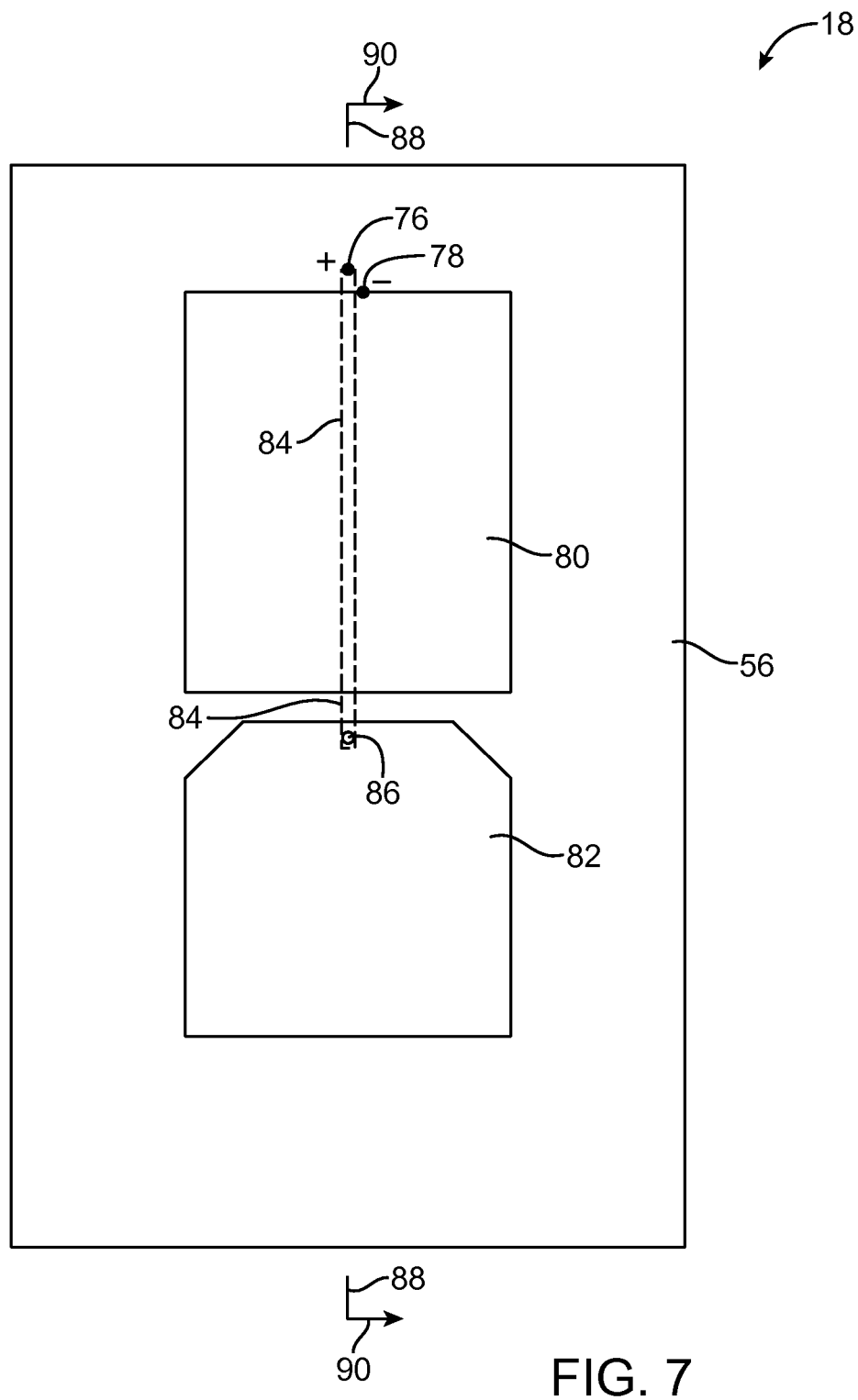
FIG. 7 is a top view of an illustrative dipole patch antenna that may be used in a wireless test probe in accordance with an embodiment of the present invention.

A top view of an illustrative dipole patch antenna of the type that may be used in forming antenna probe 18 is shown in FIG. 7. As shown in FIG. 7, antenna probe 18 may be formed from conductive traces formed on substrate 56. Substrate 56 may be, for example, a printed circuit board substrate. A positive conductor in transmission line path 24 (FIG. 1A) may be coupled to positive antenna feed terminal 76 and a ground conductor in transmission line path 24 (FIG. 1A) may be coupled to ground antenna feed terminal 78. Terminal 78 may be coupled to ground antenna patch 80 and terminal 76 may be coupled to patch 82 using a via at terminal 76, lower layer conductive path 84, and via 86.

Figure 8:
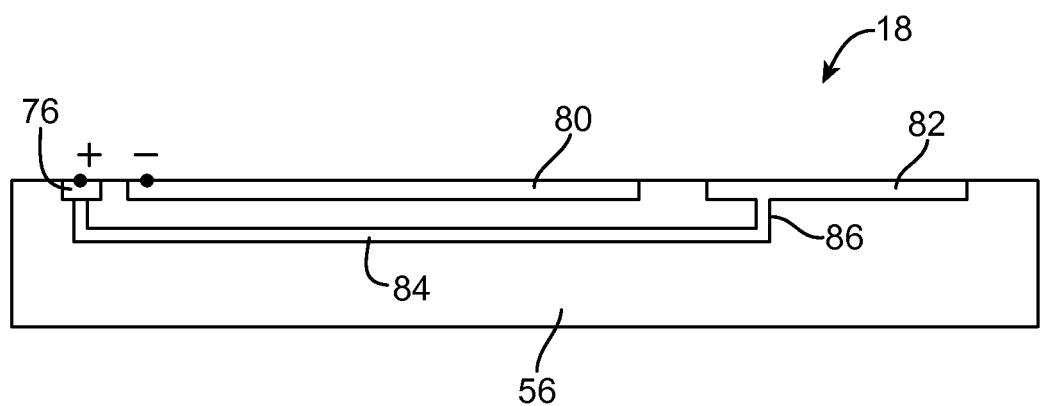
FIG. 8 is a cross-sectional side view of the dipole patch antenna of FIG. 7 in accordance with an embodiment of the present invention.

A cross-sectional side view of antenna probe 18 of FIG. 7 taken along line 88 and viewed in direction 90 is shown in FIG. 8.

Figure 9:
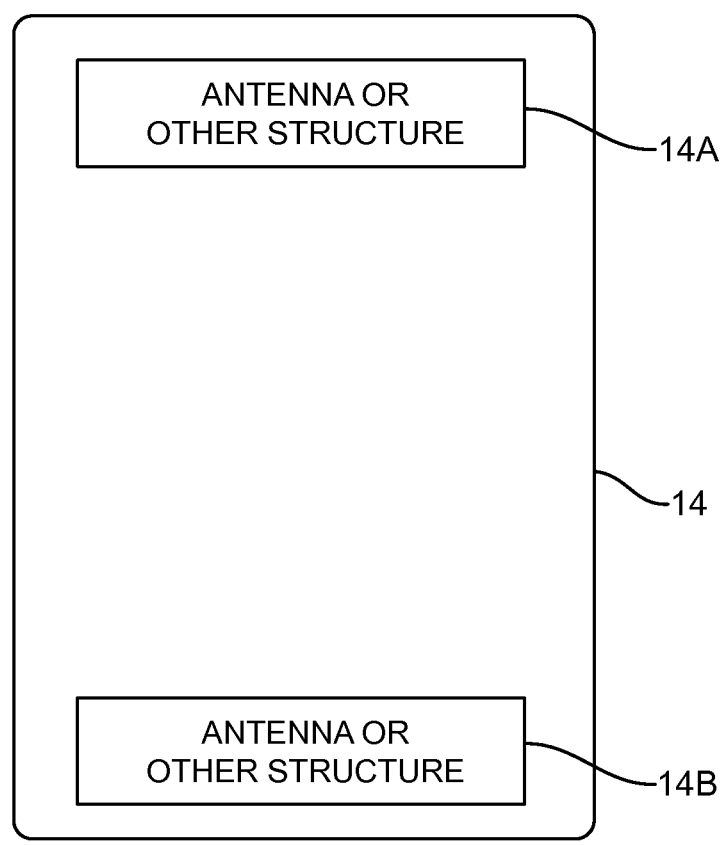
FIG. 9 is a top view of illustrative electronic device structures of the type that may be tested using a wireless test system of the type shown in FIG. 1A in accordance with an embodiment of the present invention.

FIG. 9 is a top view of illustrative device structures under test 14 that include multiple structures to be tested (e.g., structures such as structures 14A and 14B at opposing ends of structures 14, etc.). Structures 14A and 14B may be antenna structures (e.g., antenna resonating elements on flex circuits or other substrates that are attached to other circuitry in structures 14 using connectors as described in connection with connectors 40 and 38 of FIG. 2).

Figure 10:
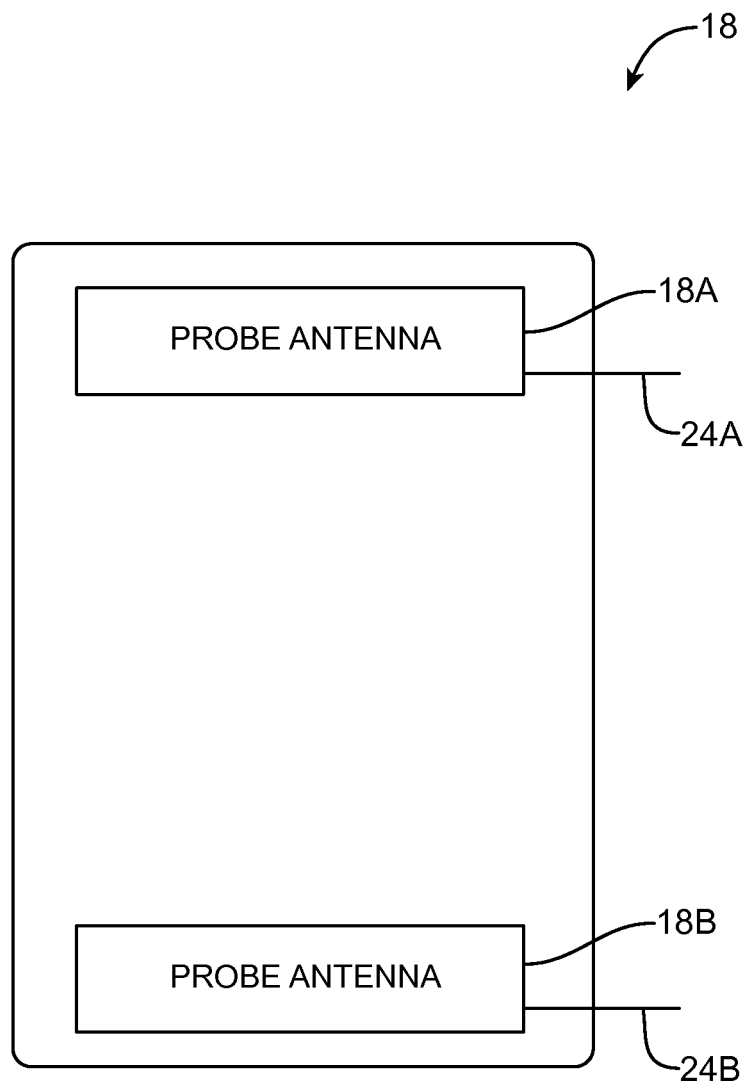
FIG. 10 is a top view of an illustrative wireless probe structure having two probe antennas that are configured to test components such as mating antennas in a device of the type shown in FIG. 9 in accordance with an embodiment of the present invention.

When testing device structures under test such as device structures under test 14 of FIG. 9, it may be desirable to provide antenna probe 18 with multiple antennas each of which corresponds to a respective one of the antennas (14A, 14B) or other structures to be tested. An illustrative antenna probe that includes two antennas 18A and 18B for testing structures 14A and 14B in device structures under test 14 is shown in FIG. 10. As shown in FIG. 10, antenna probe 18 may include first probe antenna 18A (e.g., a first loop antenna of the type shown in FIG. 6, a first dipole patch antenna of the type shown in FIGS. 7 and 8, or an antenna of another suitable type) and second probe antenna 18B (e.g., a first loop antenna of the type shown in FIG. 6, a first dipole patch antenna of the type shown in FIGS. 7 and 8, or an antenna of another suitable type). Test unit 20 may be coupled to antennas using transmission line paths 24A and 24B. If desired, paths 24A and 24B may be coupled to a single vector network analyzer port using a signal combiner, paths 24A and 24B may be coupled to separate ports in one or more vector network analyzers or other suitable test equipment, and one or more radio-frequency switches may be used in conjunction with combiners or other radio-frequency components to interconnect one or more vector network analyzer ports to one or more different paths such as paths 24A and 24B.

During testing of device structures under test 14 of FIG. 10, antenna probe 18 may be placed in the vicinity of device structures under test 14 so that probe antenna 18A is aligned with antenna or other structures 14A and so that probe antenna 18B is aligned with antenna or other structures 14B. If desired, probe antenna 18 may be provided with additional antennas. For example, if there are three or more antennas or other structures to be wirelessly tested in device structures under test 14, antenna probe 18 may be provided with three or more corresponding test antennas.

Figure 11A:
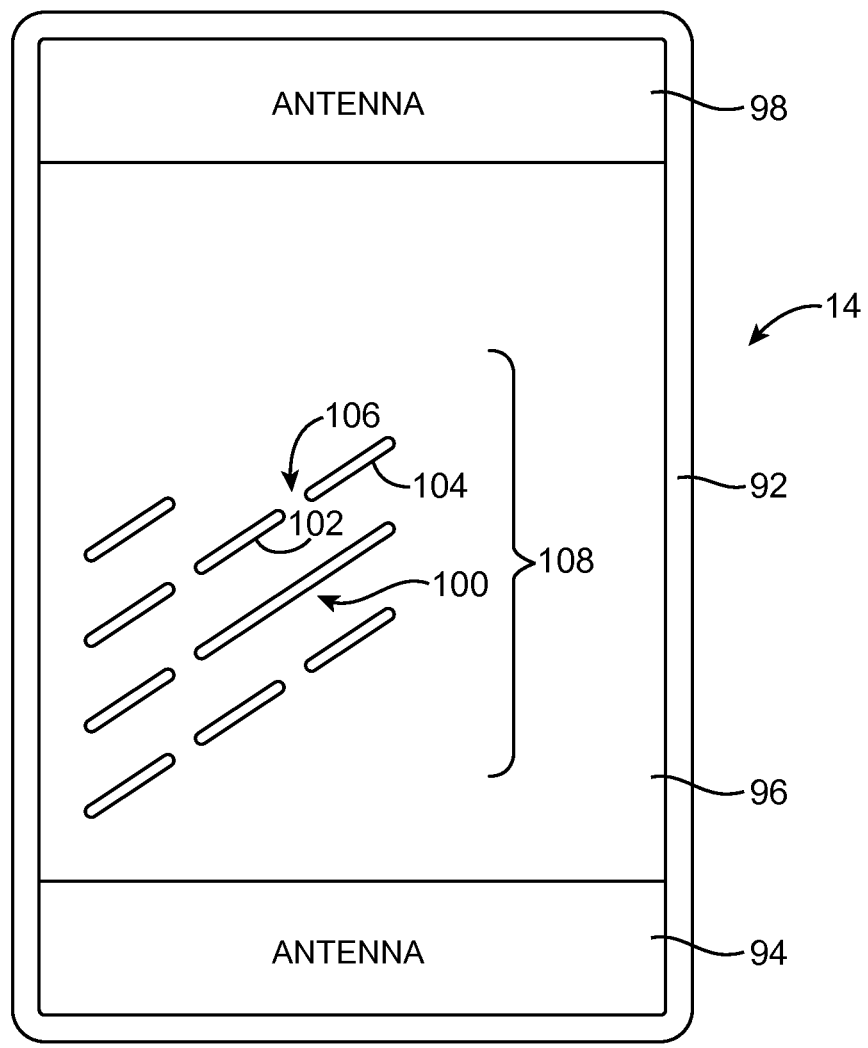
FIG. 11A is a top view of illustrative electronic device structures that include a conductive planar electronic device housing structure having slots that may be tested using a wireless probe in accordance with an embodiment of the present invention.

If desired, test system 10 may be used to test device structures such as electronic device housing structures. FIG. 11A is a top view of illustrative electronic device housing structures of the type that may be tested using test system 10. As shown in FIG. 11A, device structures under test 14 may include a partly formed electronic device (e.g., a cellular telephone, media player, computer, etc.) having a peripheral conductive housing member such as peripheral conductive housing member 92 and a planar conductive housing member such as planar conductive housing member 96. Antennas 94 and 98 may be located at opposing ends of structures 14 (as an example). Planar conductive housing member 96 may be formed from one or more sheet metal members that are connected to each other by over-molded plastic and/or welds or other fastening mechanism. Planar conductive housing member 96 may be welded to the left and right sides of planar conductive housing member 92.

Figure 11B:
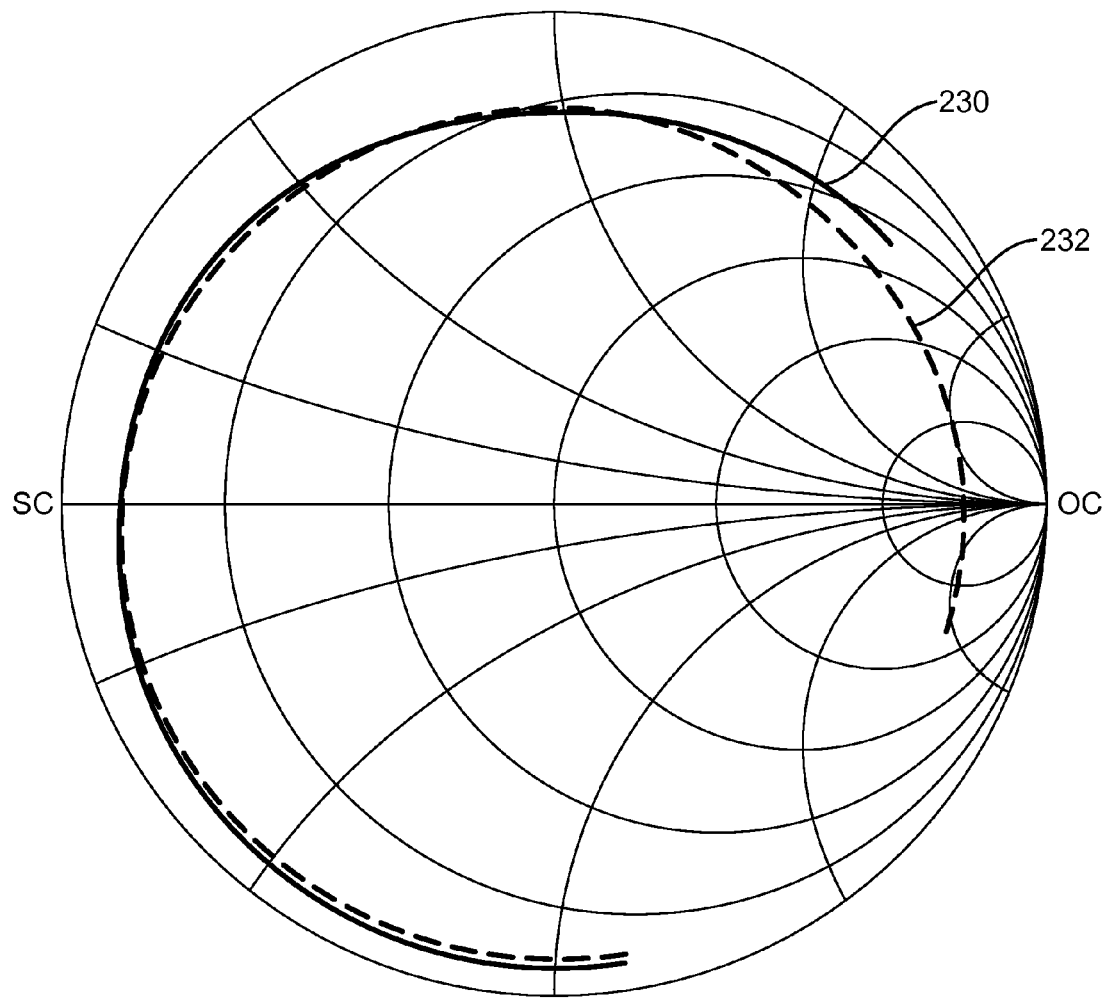
FIG. 11B is a Smith chart of illustrative test measurements that may be gathered when testing electronic device structures of the type shown in FIG. 11A in accordance with an embodiment of the present invention.

Conductive housing members in device structures under test 14 may have structural features such as openings (e.g., air-filled or plastic-filled openings or other dielectric-filled openings that are used in reducing undesirable eddy currents produced by antenna 94 and/or antenna 98), peripheral shapes, three-dimensional shapes, and other structural features whose electromagnetic properties is altered when a fault is present due to faulty manufacturing and/or assembly operations. For example, conductive housing member 96 may have openings such as openings 108. Openings 108 normally may have relatively short slots such a slots 102 and 104 that are separated by intervening portions of member 96, such as portions 106. Due to an error in manufacturing, member 96 portions 106 may be absent. In the example of FIG. 11A, portions 106 are absent between a pair of slots, so the slots merged to form relatively long slot 100. During test set-up operations, calibration measurements may be made on a properly fabricated version of member 96 (i.e., a version of member 96 where slot 100 is divided into two openings). Tester 12 may then be used to make S11 and/or S21 measurements. Illustrative S11 measurements made in a frequency range of 0.7 GHz to 2.7 GHz on structures of the type shown in FIG. 11A are shown in FIG. 11B (plotted on a Smith chart). Solid line 230 corresponds to fault-free structures. Dashed line 232 corresponds to structures in the presence of a fault such as long slot 100. A computer or other computing equipment in tester 12 may be used to compare the expected signature of device structures under test 14 to the measured data (e.g., S11 and/or S21 in magnitude, phase, or both magnitude and phase). If differences are detected, an operator may be instructed to rework or scrap structures 14 or other suitable actions may be taken.

Figure 12:
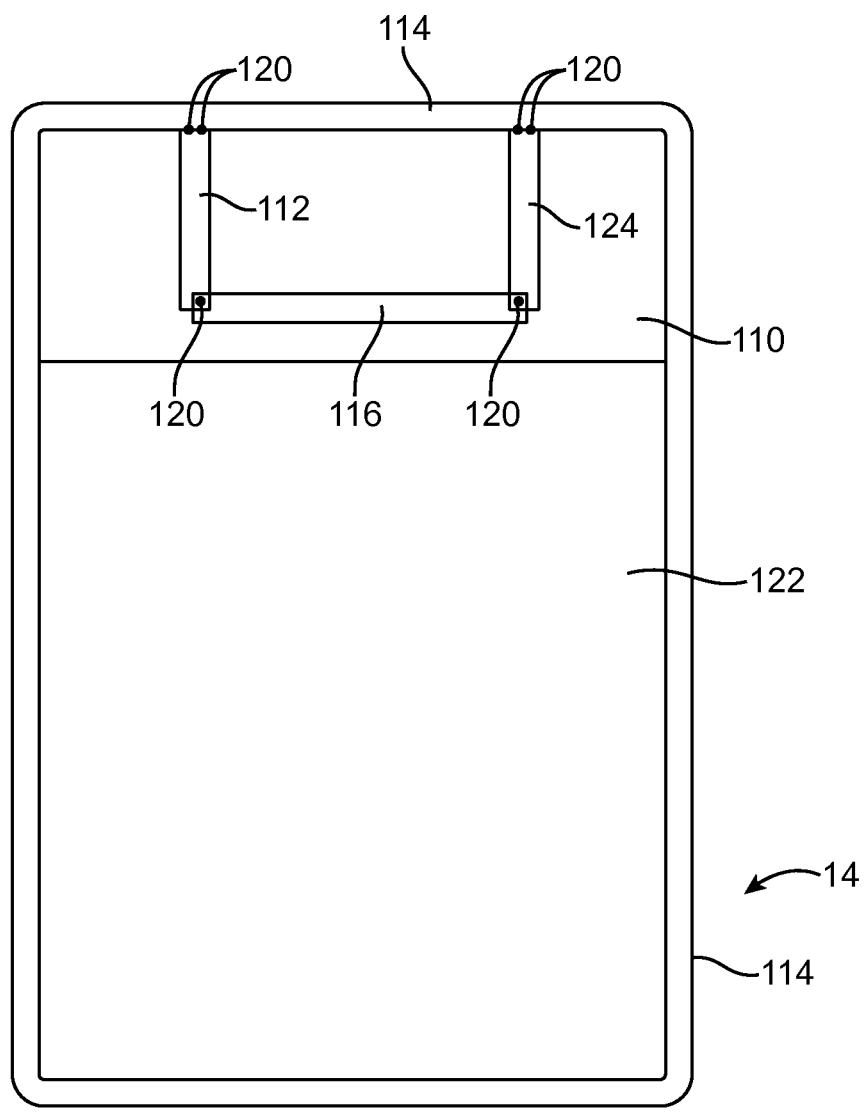
FIG. 12 is a top view of illustrative electronic device structures that include conductive structures with welds that may be tested using a wireless probe in accordance with an embodiment of the present invention.

FIG. 12 is a top view of illustrative device structures under test 14 that include welds 120. In the example of FIG. 12, structures 14 may correspond to a partly assembled electronic device such as a partly assembled cellular telephone, computer, or media player (as examples). Structures 14 may include peripheral conductive housing member 114 and conductive planar housing member 122. Member 122 may be separated from peripheral conductive housing member by dielectric-filled gap (opening) 110. Conductive structures such as members 112, 116, and 124 may be connected to each other by welds 120. When welds 120 are formed properly, tester 12 will make S11 measurements (or S21 measurements) that match calibration results for properly welded structures. When welds 120 contain faults (e.g., one or more missing or incomplete welds or a broken weld), the test measurements may exhibit detectable changes relative to the calibration results. When such a change is detected, appropriate actions may be taken. For example, an operator may be alerted so that structures 14 may be reworked, inspected further using different testing equipment, or scrapped.

Figure 13:
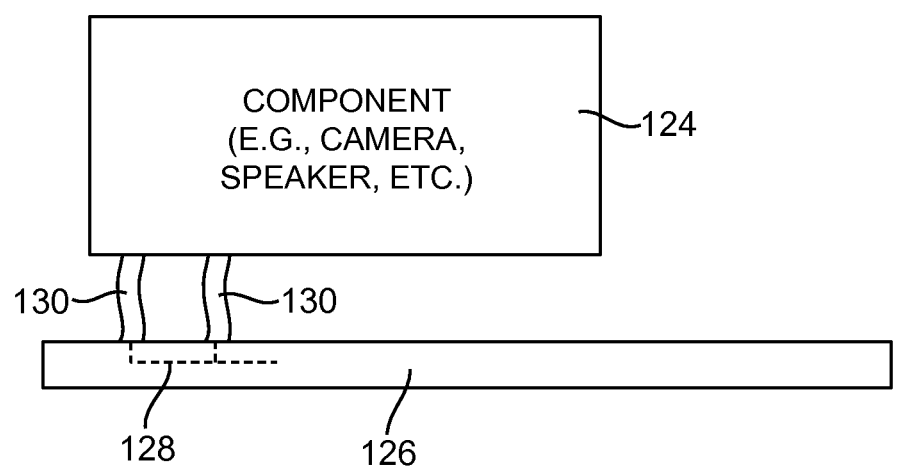
FIG. 13 is a side view of an illustrative electronic component in an electronic device that has electrical contacts that are configured to make contact with mating contacts on a printed circuit board in the device in accordance with an embodiment of the present invention.

Device structures under test 14 may include components such as speakers, microphones, switches, buttons, connectors, printed circuit boards, cables, light-emitting devices, sensors, displays, cameras, and other components. These components may be attached to each other using springs and other electrical connection mechanisms. As shown in the illustrative arrangement of FIG. 13, a component such as component 124 (e.g., a speaker, microphone, camera, etc.) may be coupled to conductive traces 128 on printed circuit board substrate 126 using one, two, or more than two springs 130 or other conductive coupling mechanisms. If component 124 and board 126 are not assembled correctly, springs 130 may not make satisfactory electrical contact to traces 128. Tester 12 may detect this change by using antenna probe 18 to make wireless test measurements on structures 14 and comparing the test measurements to calibration measurements on known properly assembled structures. If the test measurements differ from the expected measurements, appropriate actions may be taken. For example, an operator may be alerted so that structures 14 may be reworked, inspected further using different testing equipment, or scrapped.

Figure 14:
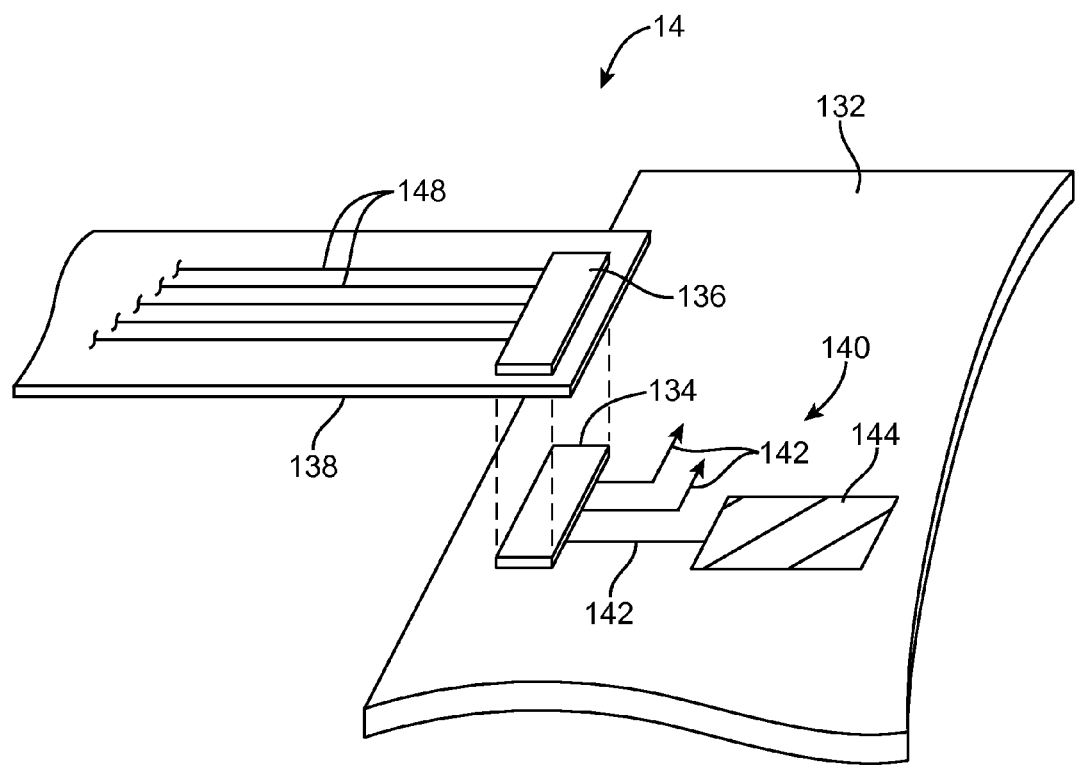
FIG. 14 is an exploded perspective view of electronic device structure including a rigid printed circuit board and a flexible printed circuit board with mating connectors of the type that may be tested using a non-contact test system of the type shown in FIG. 1A in accordance with an embodiment of the present invention.

Device structures under test 14 may include connectors. As shown in the illustrative example of FIG. 14, device structures under test 14 may include a printed circuit board such as printed circuit board 132. Printed circuit board 132 may have conductive traces 140 such as metal lines 142 and metal ground structure 144 (as an example). Connector 134 on printed circuit board 132 may be coupled to traces 140.

Device structures under test 14 may also include a flex circuit such as flex circuit 138 having conductive traces 148 that are coupled to connector 136. Flex circuit 138 may be, for example, a cable that is used to convey signals from printed circuit board 132 to a display, printed circuit board, or other component in an electronic device.

When properly assembled, connector 136 of flexible printed circuit 138 mates with connector 134 of printed circuit board 132. In this situation, each conductive line 148 may be electrically connected to a corresponding conductive line in traces 140 (as an example). In the presence of a fault such as an improperly connected or disconnected pair of connectors such as connectors 136 and 134 or breaks or shorts in traces 148 and 140, the electromagnetic properties of device structures under test 14 may be altered. For example, in a properly assembled configuration, one or more ground lines in conductors 148 may be shorted to ground trace 144, whereas in an improperly assembled configuration, trace 144 and the ground lines in conductors 148 may be electrically isolated. Tester 12 may detect faults in device structures under test such as structures 14 of FIG. 14 and other structures that contain connectors by using antenna probe 18 to make wireless test measurements on structures 14 and comparing these test measurements to calibration measurements on a known properly assembled structure. In response to determining that the test measurements differ from expected measurements, appropriate actions may be taken such as alerting an operator that structures 14 should be inspected further, reworked, or scrapped.

Figure 15:
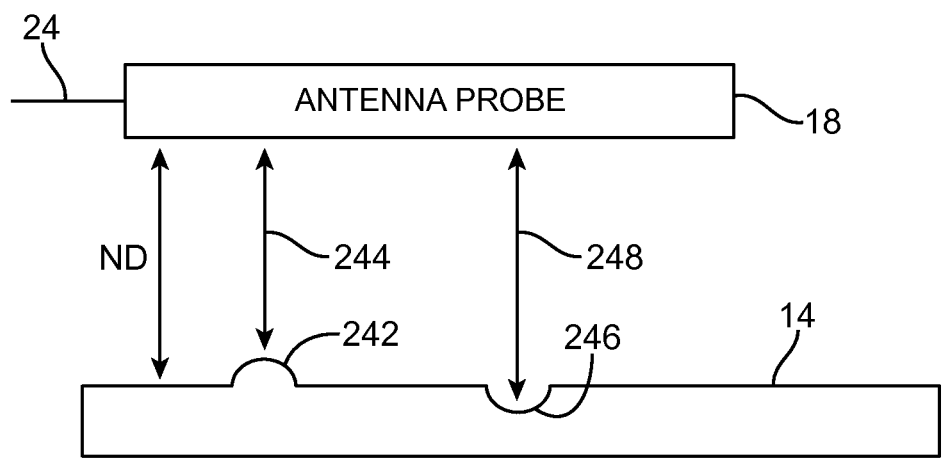
FIG. 15 is a side view of illustrative electronic device structures that include surface height variations that may be tested using a wireless probe in accordance with an embodiment of the present invention.

FIG. 15 is a side view of illustrative electronic device structures that include surface height variations that may be tested using test system 12. In the example of FIG. 15, device structures under test 14 include surface faults such as depression 246 and protrusion 242. Device structures under test 14 of FIG. 15 may be a device housing structure, a planar structure associated with a component, a metal plate, a printed circuit board, or other structure that is subject to potential surface faults during manufacturing. During testing, system 12 may detect protrusions such as protrusion 242 due to the shortened distance 244 between structures 14 and antenna probe 18 and due to the local change in surface area associated with protrusion 242. System 12 may likewise detect depressions such a depression 246 due to the increase in distance 248 relative to the nominal distance ND between antenna probe 18 and structures 14 and due to the local change in surface area associated with depression 246.

Figure 16:
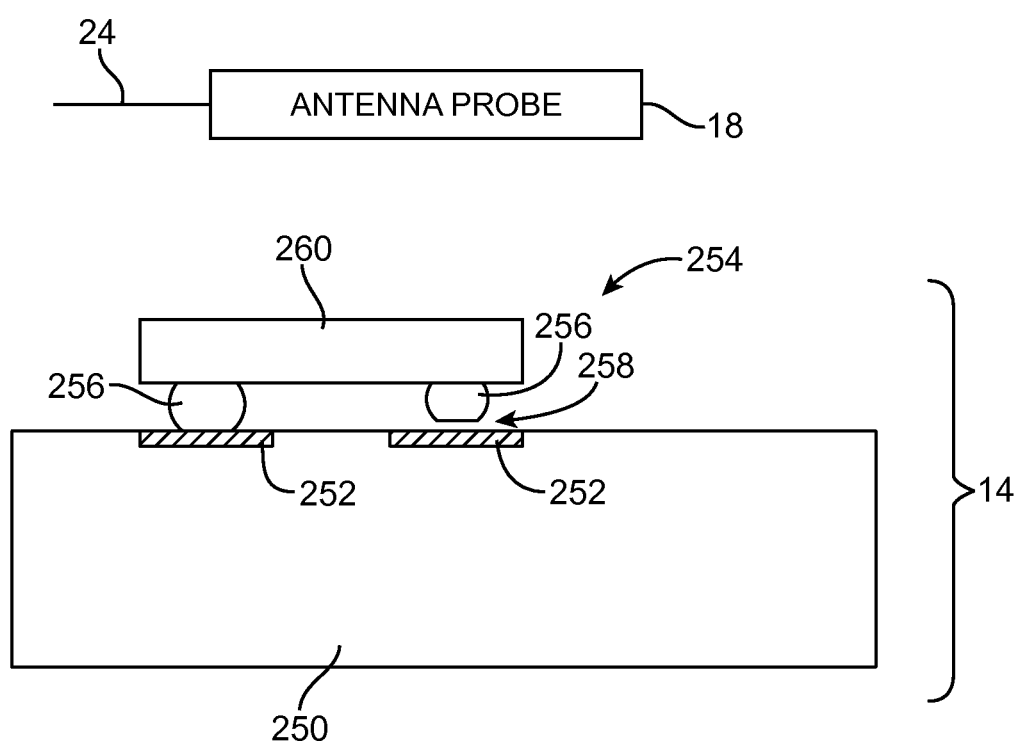
FIG. 16 is a side view of an illustrative electronic component mounted to a substrate using solder of the type that may be tested using a wireless probe in accordance with an embodiment of the present invention.

FIG. 16 is a side view of an illustrative electronic component such as surface mount assembly (SMA) structures 254 mounted to a substrate such as substrate 250 (e.g., a printed circuit board). This type of electronic device structure may be tested using antenna probe 18 and system 12. When properly assembled, electronic component 260 will be attached to traces 252 on substrate 250 using solder balls 256. In the presence of a fault such as gap 258, the radio-frequency signature of device structures under test 14 will be different, which can be detected by system 12 (e.g., using S11 and/or S21 measurements).

Figure 17:
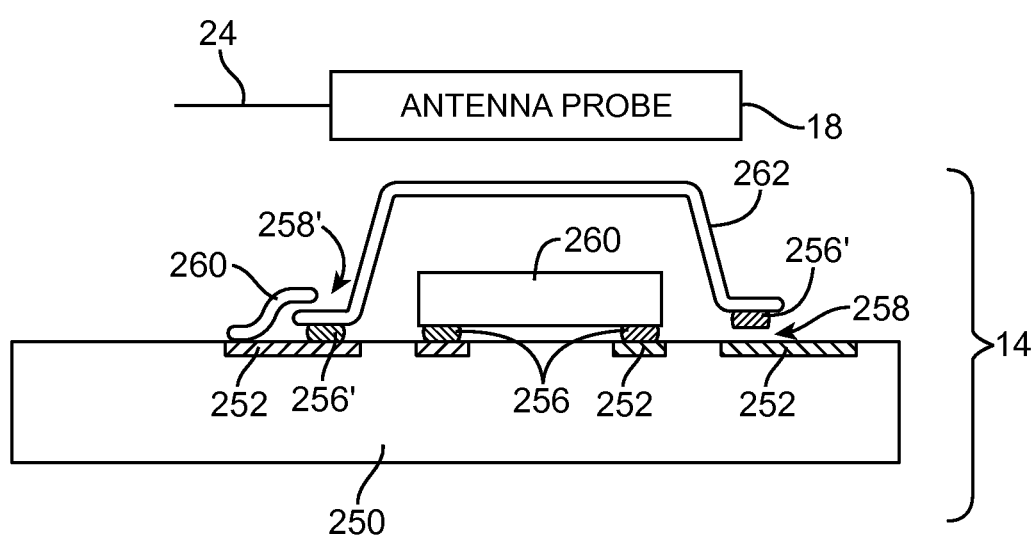
FIG. 17 is a side view of an illustrative electronic component covered with an electromagnetic shield structure the type that may be tested using a wireless probe in accordance with an embodiment of the present invention.

In the example of FIG. 17, an electronic device component such as component 260 has been electromagnetically shielded using electromagnetic shielding can 262. When properly assembled, springs such as spring 260 and/or solder such a solder 256' may form electrical connections between can 262 and traces such as 52 (e.g., ground traces) on substrate 250. In the presence of a fault such as an incomplete solder connection (shown as gap 258) or an incomplete spring connection (shown as gap 258'), system 12 can detect abnormal S11 and/or S21 characteristics.

Figure 18:
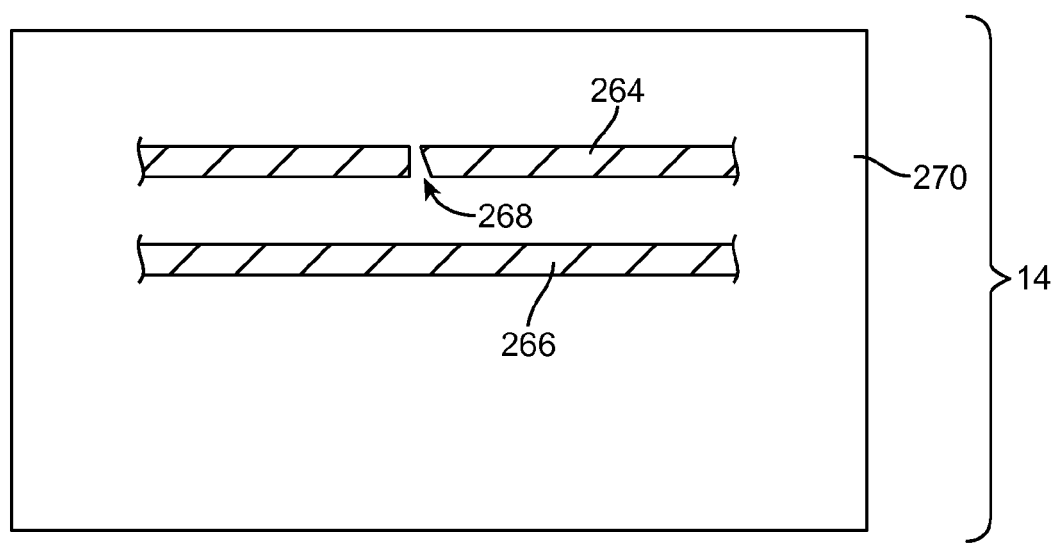
FIG. 18 is a top view of a pair of metal traces on a substrate of the type that may be tested using a wireless probe in accordance with an embodiment of the present invention.

As shown in FIG. 18, device structures under test 14 may include traces such as traces 264 and 266 on substrate 270. Traces 262 and 264 may, for example, be part of a patterned metal layer that forms part of a transmission line or a digital bus or other signal path that interconnects electronic components within an electronic device. During testing to gather S11 and/or S21 measurements with antenna probe 18, system 12 may detect the presence of faults such as shorts, opens, etc. In the example of FIG. 18, trace 264 contains an open fault due to the presence of gap 268.

Figure 19:
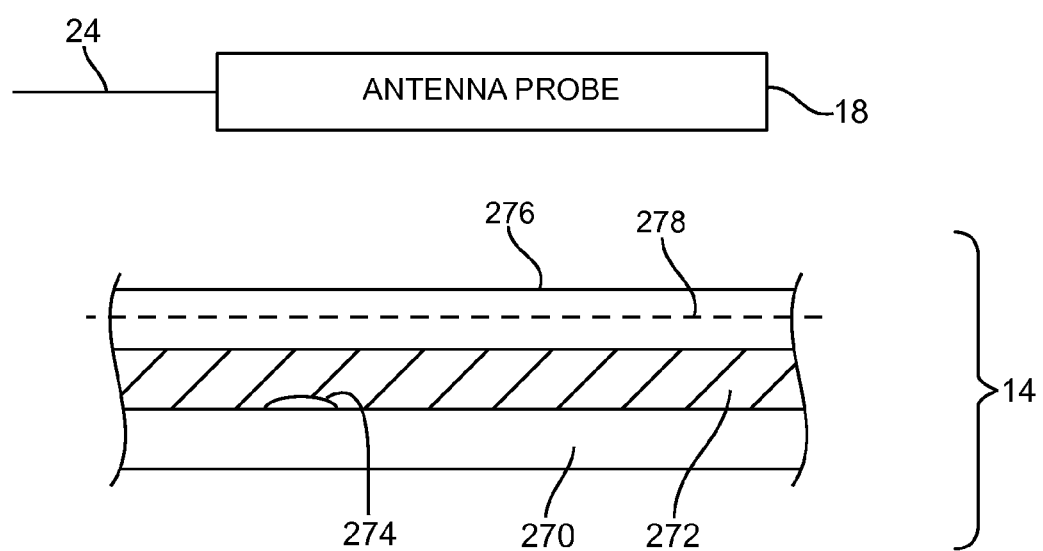
FIG. 19 is a cross-sectional side view of device structures under test that include a dielectric layer of the type that may be tested for defects with a wireless probe in accordance with an embodiment of the present invention.

FIG. 19 is a cross-sectional side view of illustrative device structures under test 14 showing how faults in materials such as conductive foam layers may be detected using antenna probe 18. In the FIG. 19 example, device structures under test 14 include a flexible printed circuit "flex circuit" such as flex circuit 276. Flex circuit 276 may contain traces such as traces 278. Flex circuit 278 may be mounted on structure 270 using conductive foam 272. Structure 270 may be a printed circuit board (e.g., a printed circuit board containing a ground plane trace, a metal shielding can, a planar metal housing structure for an electronic device, or other conductive structure). In the FIG. 19 example, a fault such as bubble 274 is present, which changes the shape and size of conductive foam 272. During testing with system 12, system 12 may detect the presence of fault 274 through gathered S11 and/or S21 measurements.

Figure 20:
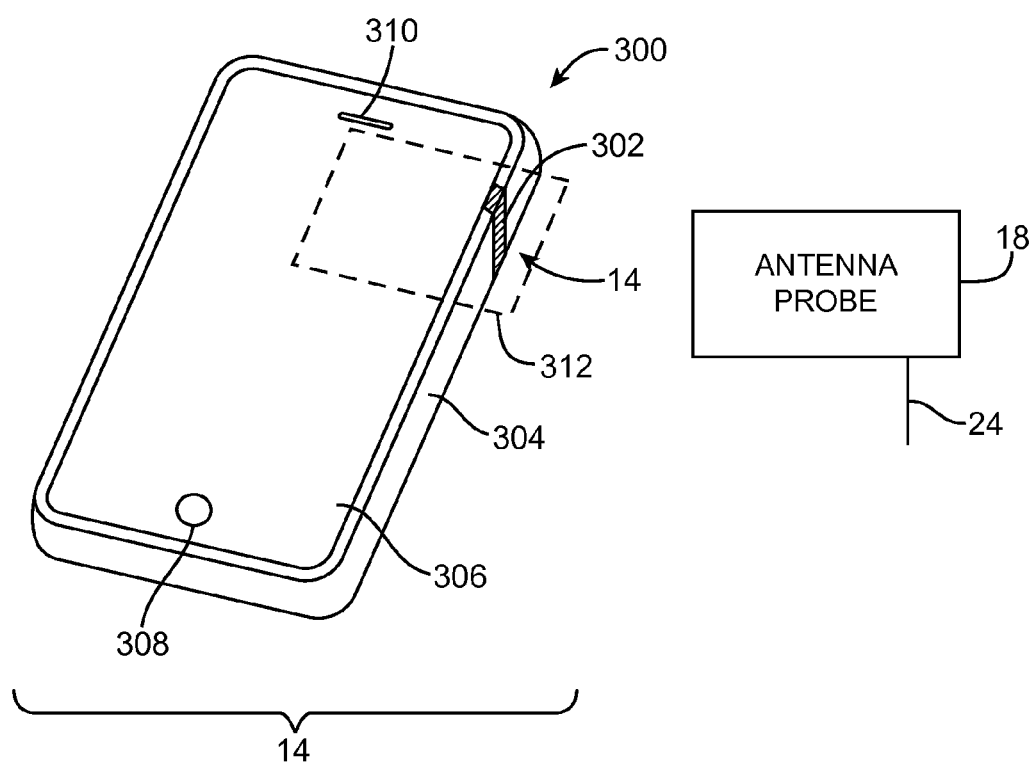
FIG. 20 is a perspective view of an electronic device having a peripheral conductive member of the type that may be tested using a wireless probe in accordance with an embodiment of the present invention.

In the example of FIG. 20, device structures under test 14 include a completed or partially assembled electronic device such as device 300. Device 300 may have a display such as display 306. A cover glass layer over the display may be provided with openings for button 308 and speaker port 310. Peripheral conductive housing member 304 (e.g., a display bezel or housing sidewall member) may be formed from a conductive material such as metal. Structures such as dielectric gap 302 may be included in peripheral conductive housing member 304 and may affect the electromagnetic properties of device structures under test 14. During the testing, antenna probe 18 may be placed in the vicinity of gap 302 (e.g., in the location indicated by dashed line 312). System 12 may detect the presence of a fault such as a faulty conductive structure that bridges and thereby shorts gap 302 using gathered S11 and/or S21 data. If desired, measurements of this type may be performed on peripheral conductive housing member 304 before peripheral conductive housing member 304 is attached to other device structures.

Figure 21:
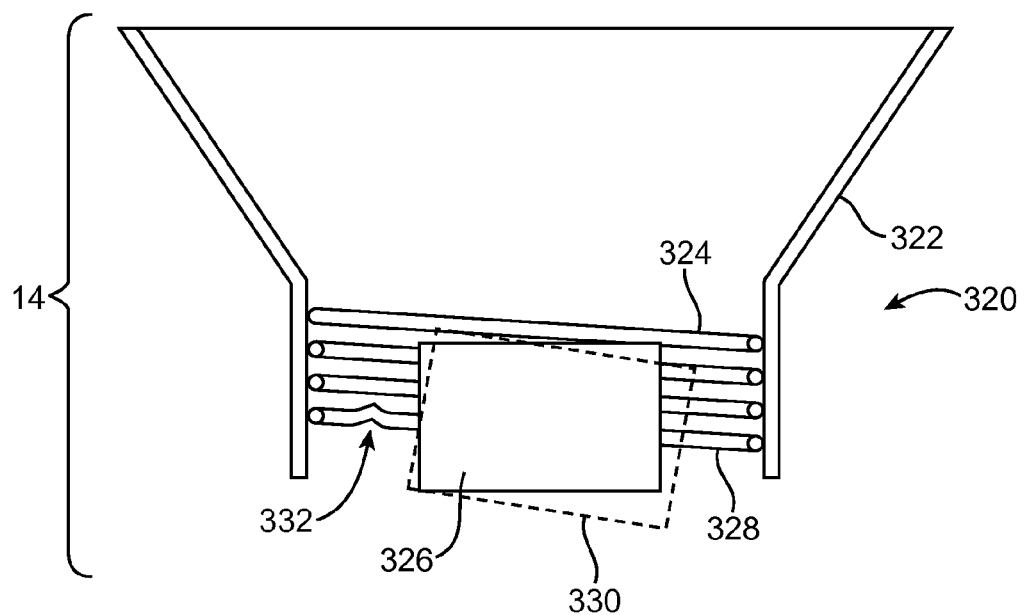
FIG. 21 is a cross-sectional side view of an illustrative speaker of the type that may be tested using a wireless probe in accordance with an embodiment of the present invention.

Device structures under test 14 may include electrical device structures such as illustrative speaker 320. As shown in the cross-sectional side view of speaker 320 of FIG. 21, speaker 320 may include a diaphragm such as diaphragm 322. Coils 328 may be attached to diaphragm 322 and may surround magnet 326. Faults that may be measured by system 12 by gathering S11 and/or S21 using antenna probe 18 include coil faults such as a full or partial opening in coil 328 at location 332 and magnet faults such as erroneous magnet mounting location 330 (as examples). The testing of a speaker in the FIG. 21 example is merely illustrative. Other components may be tested using tester 12 is desired.

Tester 12 may, in general, be used to test electronic device structures that include antennas, conductive structures such as conductive housing structures, connectors, springs, and other conductive structures that form electrical connections, speakers, shielding cans, solder-mounted components such as integrated circuits, transmission lines and other traces, layers of conductive foam, other electrical components, or any other suitable conductive structures that interact with transmitted radio-frequency electromagnetic signals. The foregoing examples are merely illustrative.

Figure 22:
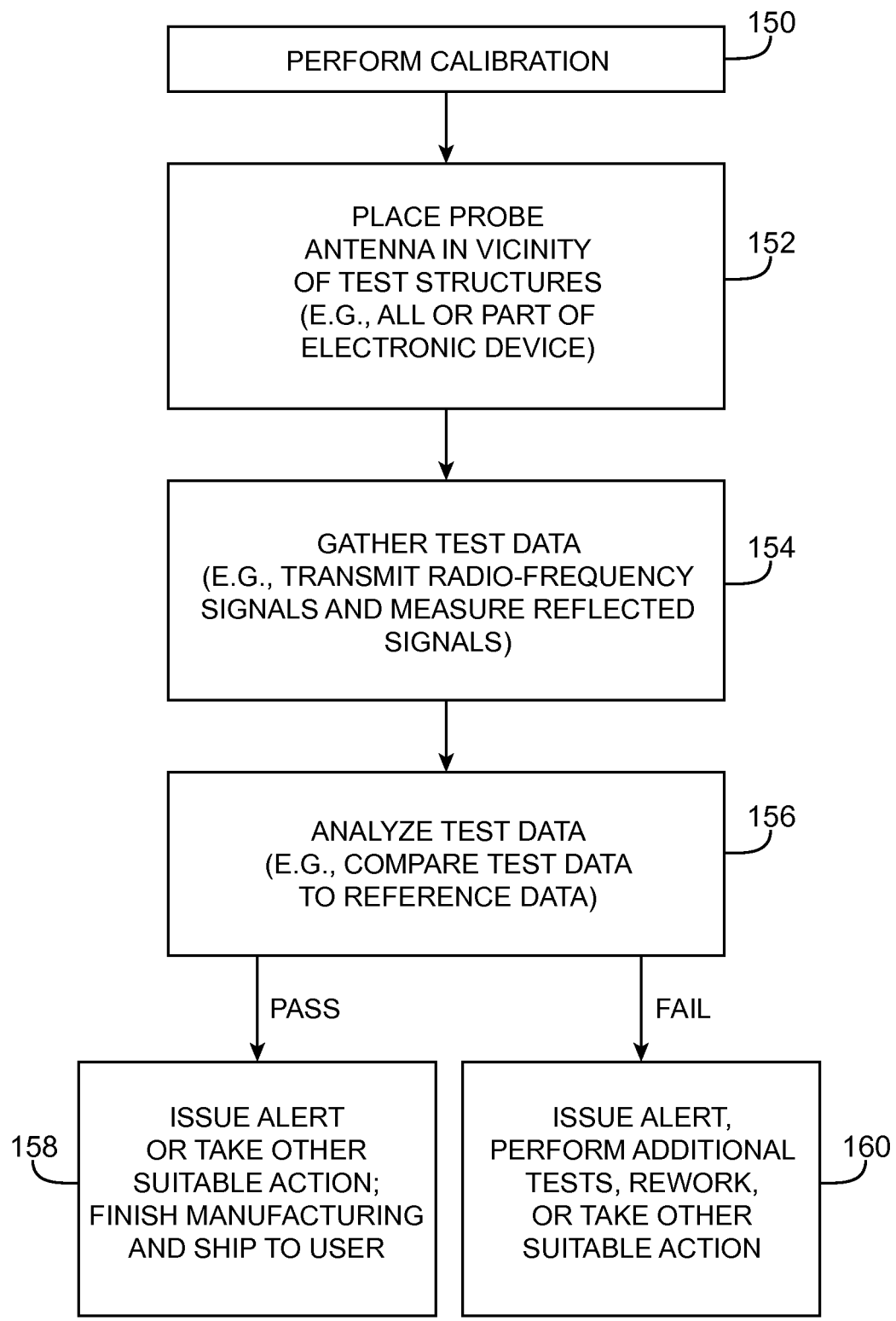
FIG. 22 is a flow chart of illustrative steps involved in wirelessly testing electronic devices and structures in electronic devices using a wireless test system of the type shown in FIG. 1A in accordance with an embodiment of the present invention.

Illustrative steps involved in performing non-contact tests on device structures under test 14 using tester 12 of system 10 are shown in FIG. 22.

At step 150, calibration operations may be performed on properly manufactured and assembled device structures. In particular, tester 12 may use antenna probe 18 to transmit and receive radio-frequency signals in a desired frequency range (e.g., from 0 Hz to 3 GHz, from 3-14 GHz, a subset of one of these frequency ranges, or another suitable frequency range). Signals corresponding to the transmitted signals may be received from the device structures under test and processed with the transmitted signals to obtain S11 and/or S21 measurements or other suitable test data. The S11 and/or S21 measurements or other test measurements that are made on the properly manufactured and assembled device structures may be stored in storage in tester 12 (e.g., in storage on a vector network analyzer, in storage on computing equipment such as a computer or network of computers in test unit 20 that are associated with the vector network analyzer, etc.). If desired, the device structures that are tested during the calibration operations of step 150 may be "limit samples" (i.e., structures that have parameters on the edge or limit of the characteristic being tested. Device structures of this type are marginally acceptable and can therefore be used in establishing limits on acceptable device performance during calibration operations.

At step 152, one or more antennas in antenna probe 18 may be placed in the vicinity of device structures under test 14 (e.g., manually or using computer-controlled positioners such as positioners 16 and 32 of FIG. 1A).

At step 154, tester 12 may use antenna probe 18 to gather test data. During the operations of step 154, tester 12 may use antenna probe 18 to transmit and receive radio-frequency signals in a desired frequency range (e.g., from 0 Hz to 3 GHz, 3 GHz to 14 GHz, or other suitable frequency range, preferably matching the frequency range used in obtaining the calibration measurements of step 150). Wireless test data such as S11 and/or S21 measurements or other suitable test data may be gathered. The S11 and/or S21 measurements (phase and magnitude measurements for impedance and forward transfer coefficient) may be stored in storage in tester 12.

At step 156, the radio-frequency test data may be analyzed. For example, the test data that was gathered during the operations of step 154 may be compared to the baseline (calibration) data obtained during the operations of step 150 (e.g., by calculating the difference between these sets of data and determining whether the calculated difference exceeds predetermined threshold amounts, by comparing test data to calibration data from limit samples that represents limits on acceptable device structure performance, or by otherwise determining whether the test data deviates by more than a desired amount from acceptable data values). After computing the difference between the test data and the calibration data at one or more frequencies to determine whether the difference exceeds predetermined threshold values, appropriate actions may be taken. For example, if the test data and the calibration data differ by more than a predetermined amount, tester 12 may conclude that device structures under test 14 contain a fault and appropriate actions may be taken at step 160 (e.g., by issuing an alert, by informing an operator that additional testing is required, by displaying information instructing an operator to rework or scrap the device structures, etc.). If desired, visible messages may be displayed for an operator of system 12 at step 160 using display 200. In response to a determination that the test data and the calibration data differ by less than the predetermined amount, tester 12 may conclude that device structures under test 14 have been manufactured and assembled properly and appropriate actions may be taken at step 158 (e.g., by issuing an alert that the structures have passed testing, by completing the assembly of the structures to form a finished electronic device, by shipping the final assembled electronic device to a customer, etc.). If desired, visible messages may be displayed for an operator of system 12 at step 158 using display 200.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for testing electronic device housing structures under test using a tester that has a test unit and an associated antenna probe, comprising:
    generating radio-frequency test signals with the test unit;
    wirelessly transmitting the radio-frequency test signals to the device housing structures under test using the antenna probe;
    receiving corresponding radio-frequency test signals from the device housing structures under test using the antenna probe;
    providing the received radio-frequency test signals to the test unit from the antenna probe;
    determining from at least the received radio-frequency test signals whether the device housing structures under test contain a fault; and
    performing calibration operations to obtain calibration data, wherein determining from at least the received radio-frequency test signals whether the device housing structures under test contain a fault comprises comparing the received radio-frequency test signals to the calibration data.

2. The method defined in claim 1, wherein the received radio-frequency test signals comprises reflected radio-frequency test signals, and wherein determining from at least the received radio-frequency test signals whether the device housing structures under test contain a fault comprises using the reflected radio-frequency test signals to determine whether the device housing structures under test contain a fault.

3. The method defined in claim 2 further comprising issuing an alert with the tester when comparing the reflected radio-frequency test signals to the calibration data reveals that the reflected radio-frequency test signals and the calibration data differ by more than a predetermined amount.

4. The method defined in claim 1, wherein performing calibration operations comprises gathering the calibration data by using the test unit and antenna probe to perform measurements on a properly assembled version of the device housing structures under test.

5. The method defined in claim 4 wherein the antenna probe contains first and second test antennas and wherein wirelessly transmitting the radio-frequency test signals comprises wirelessly transmitting the radio-frequency test signals using the first and second test antennas.

6. The method defined in claim 5 wherein the device housing structures under test include first and second device antennas, the method further comprising placing the first and second test antennas respectively in the vicinity of the first and second device antennas while transmitting the radio-frequency test signals.

7. The method defined in claim 4 wherein the antenna probe contains at least one probe antenna and wherein the device housing structures under test include at least one device antenna, the method further comprising placing the antenna probe in the vicinity of the device antenna while transmitting the radio-frequency test signals.

8. The method defined in claim 1 wherein the device housing structures under test include a first connector and include a second connector coupled to an antenna resonating element and wherein determining from at least the received radio-frequency test signals whether the device housing structures under test contain a fault comprises determining whether the first and second connectors are properly connected to each other.

9. The method defined in claim 1 further comprising:
    placing the device housing structures under test in a test fixture before wirelessly transmitting the radio-frequency test signals to the device structures under test using the antenna probe.

10. A method for testing electronic device housing structures under test using a tester that has at least one test antenna, comprising:
    with the tester, transmitting radio-frequency test signals to the device housing structures under test using the test antenna;
    receiving corresponding radio-frequency test signals from the device housing structures under test using the test antenna;
    determining from at least the received radio-frequency signals whether the device housing structures under test contain a fault; and
    performing calibration operations to obtain calibration data, wherein determining from at least the received radio-frequency test signals whether the device housing structures under test contain a fault comprises comparing the received radio-frequency test signals to the calibration data.

11. The method defined in claim 10 further comprising:
    in response to determining that the device housing structures under test contain a fault, displaying an alert on a display.

12. The method defined in claim 10 wherein receiving the corresponding radio-frequency test signals from the device housing structures under test using the test antenna comprises receiving near-field radio-frequency test signals.

13. A test system for performing non-contact testing on electronic device structures under test, comprising:
    a test unit that generates radio-frequency test signals; and
    an antenna with which the radio-frequency test signals are transmitted to the electronic device structures under test and with which corresponding radio-frequency test signals are received, wherein the test unit is configured to determine whether the electronic device structures under test include a fault based on the transmitted and received radio-frequency test signals, wherein the radio-frequency test signals that are received includes reflected versions of the transmitted radio-frequency test signals, wherein the test unit comprises a network analyzer, wherein the radio-frequency test signals include signals that range from a first frequency to a second frequency, and wherein the test unit computes complex impedance data from the transmitted and reflected versions of the radio-frequency test signals.

14. The test system defined in claim 13, further comprising: performing calibration operations to obtain baseline data from a known fault-free version of the electronic device structures under test, wherein the test unit is configured to compare the computed complex impedance data to the baseline data to determine whether the electronic device structures under test include a fault.

* * * * *